United States Patent
Silva et al.

(10) Patent No.: US 9,742,426 B2
(45) Date of Patent: Aug. 22, 2017

(54) SIGNAL TRANSFER FUNCTION EQUALIZATION IN MULTI-STAGE DELTA-SIGMA ANALOG-TO-DIGITAL CONVERTERS

(71) Applicant: ANALOG DEVICES, INC., Norwood, MA (US)

(72) Inventors: Jose Barreiro Silva, Bedford, MA (US); Donald W. Paterson, Winchester, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/359,240

(22) Filed: Nov. 22, 2016

(65) Prior Publication Data

US 2017/0170841 A1   Jun. 15, 2017

Related U.S. Application Data

(60) Provisional application No. 62/267,330, filed on Dec. 15, 2015.

(51) Int. Cl.
*H03M 1/06* (2006.01)
*H03M 3/00* (2006.01)
*H03H 17/02* (2006.01)

(52) U.S. Cl.
CPC ........ *H03M 3/358* (2013.01); *H03H 17/0248* (2013.01); *H03H 17/0294* (2013.01); *H03M 3/458* (2013.01)

(58) Field of Classification Search
CPC ........ H03M 3/344; H03M 1/12; H03M 1/144; H03M 1/145; H03M 3/416

(Continued)

(56) References Cited

U.S. PATENT DOCUMENTS

| | | | |
|---|---|---|---|
| 4,862,169 A | * | 8/1989 | van Bavel ............. H03M 3/418 341/143 |
| 5,959,562 A | | 9/1999 | Wiesbauer |

(Continued)

FOREIGN PATENT DOCUMENTS

| | | |
|---|---|---|
| CN | 101330482 | 7/2012 |
| EP | 2930850 | 3/2015 |

OTHER PUBLICATIONS

Muhammed Bolatkale et al., A 4GHz CT γΣ ADC with 70dB DR and -74dBFS THD in 125MHz BW, ISSCC 2011 / Session 27 / Oversampling Converters / 27.1, 2011 IEEE International Solid-State Circuits Conference, 978-1-61284-302-5/11 © 2011 IEEE, 3 pages.

(Continued)

*Primary Examiner* — Khai M Nguyen
(74) *Attorney, Agent, or Firm* — Patent Capital Group

(57) ABSTRACT

Typically, complex systems require a separate and expensive equalizer at the output of an analog-to-digital converter (ADC). Rather than providing a separate equalizer, the effective Signal Transfer Function (STF) of a Multi-stAge noise SHaping (MASH) ADC can be modified by leveraging available digital filtering hardware necessary for quantization noise cancellation. The modification can involves adding calculations in the software previously provided for computing digital quantization noise cancellation filter coefficients, where the calculations are added to take into account equalization as well. As a result, the signal transfer function can be modified to meet ADC or system-level signal-chain specifications without additional equalization hardware. The method is especially attractive for high-speed applications where magnitude and phase responses are more challenging to meet.

20 Claims, 11 Drawing Sheets

(58) Field of Classification Search
USPC .................................................. 341/118, 143
See application file for complete search history.

(56) References Cited

U.S. PATENT DOCUMENTS

| | | | |
|---|---|---|---|
| 6,275,177 B1* | 8/2001 | Ho | H03M 3/354 |
| | | | 341/143 |
| 6,518,904 B1* | 2/2003 | Jelonnek | H03M 7/3022 |
| | | | 341/143 |
| 6,873,281 B1 | 3/2005 | Esterberg et al. | |
| 6,965,275 B2 | 11/2005 | Di Giandomenico et al. | |
| 6,970,120 B1 | 11/2005 | Bjornsen | |
| 6,980,145 B1 | 12/2005 | Tammineedi | |
| 7,042,375 B1 | 5/2006 | van Engelen | |
| 7,321,325 B2 | 1/2008 | Hsieh et al. | |
| 7,385,537 B2 | 6/2008 | Yang et al. | |
| 7,548,071 B2 | 6/2009 | Harrison et al. | |
| 7,626,525 B2* | 12/2009 | Zhou | H03M 3/352 |
| | | | 341/118 |
| 2006/0195776 A1 | 8/2006 | Yang et al. | |
| 2007/0090980 A1 | 4/2007 | Lin | |
| 2011/0163900 A1 | 7/2011 | Pagnanelli | |
| 2013/0194114 A1 | 8/2013 | Ritter et al. | |
| 2015/0288379 A1 | 10/2015 | Silva et al. | |

OTHER PUBLICATIONS

Hajime Shibata et al., A DC-to-1 GHz Tunable RF γΣ ADC Achieving DR= 74 dB and BW= 150 MHz at f0 = 450 MHz Using 550 mW, © 2012 IEEE, 10 pages.

Yunzhi Dong et al., *A 235mW CT 0-3 MASH ADC Achieving -167dBFS/Hz NSD with 53MHz BW*, ISSCC 2014 / Session 29 / Data Converters for Wireless Systems / 29.2, © 2014 IEEE International Solid-State Circuits Conference, 3 pages.

Do-Yeon Yoon et al., *An 85dB-DR 74.6dB-SNDR 50MHz-BW CT MASH γΣ Modulator in 28nm CMOS*, ISSCC 2015 / Session 15 / Data-Converter Techniques / 15.1, 2015 IEEE International Solid State Circuits Conference © 2015 IEEE, 3 pages.

Péter Kiss et al., *Adaptive Digital Correction of Analog Errors in MASH ADCs—Part II. Correction Using Test-Signal Injection*, IEEE Transactions on Circuits and Systems—II: Analog and Digital Signal Processing, vol. 47, No. 7, Jul. 2000, 9 pages.

Gert Cauwengerghs et al., *Adaptive Digital Correction of Analog Errors in MASH ADC's—Part I: Off-Line and Blind On-Line Calibration*, IEEE Transactions on Circuits and Systems—II: Analog and Digital Signal Processing, vol. 47, No. 7, Jul. 2000, 8 pages.

J. Silva et al., *Digital Techniques for Improved γΣ Data Conversion*, IEEE Custom Integrated Circuits Conference © 2000, 8 pages.

Péter Kiss, *Adaptive Digital Compensation of Analog Circuit Imperfections for Cascaded Delta-Sigma Analog-to-Digital Converters*, Center for Design of Analog-Digital Integrated Circuits, Aug. 20, 1999, Oregon State University, 123 pages.

Victor Rodolfo Gonzalez-Diaz et al., *Efficient Dithering in MASH Sigma-Delta Modulators for Fractional Frequency Synthesizers*, article found in Circuits and Systems I: Regular Papers, IEEE Transactions on Oct. 2010, 11 pages.

Do-Yeon Yoon et al., *A Continous-Time Sturdy MASH γΣ Modulator in 28 nm CMOS*, IEEE Journal of Solid-State Circuits, vol. 50, No. 12, Dec. 2015, 11 pages.

Do-Yeon Yoon, *A Continous-Time Multi-Stage Noise Shaping Delta-Sigma Modulator for Next Generation Wireless Applications*, Jun. 2015 © Massachusetts Institute of Technology, 121 pages.

Yunzhi Dong et al., A Continuous-Time 0-3 MASH ADC Achieving 88 dB DR with 53 MHz BW in 28 nm CMOS, IEEE Journal of Solid-State Circuits, vol. 29, No. 12, Dec. 2014, 10 pages.

Yun-Shiang Shu et al., *LMS-Based Noise Leakage Calibration of Cascaded Continuous-Time γΣ Modulators*, IEEE Journal of Solid-State Circuits, vol. 45, No. 2, Feb. 2010, 12 pages.

Romuald Mazurek et al., *Application of Maximum-Length Sequences to Impulse Response Measurement of Hydroacoustic Communications Systems*, Gdańsk University of Technology, Gdańsk, Poland, 8 pages.

Non-Final Office Action (OA1) issued in U.S. Appl. No. 15/360,984 dated Mar. 27, 2017, 9 pages.

EP Search Report issued in EP Patent Application No. 16201799.0 dated Apr. 11, 2017, 12 pages.

European Search Report issued in EP Patent Application Serial No. 16202962.3 dated May 12, 2017, 12 pages.

Extended EP Search Report issued in EP Patent Application Serial No. 16201799.0 dated May 12, 2017, 10 pages.

Sudharsan Kanagaraj et al., *An Online Fully-digital Calibration of Leakage Noise in MASH Continuous Time γΣ modulators*, ©2011 IEEE, 978-1-4244-9474-3/11, 4 pages.

Bahar Jalali-Farahani et al., Adaptive Noise Cancellation Techniques in Sigma-Delta Analog-to-Digital Converters, © 2007 IEEE, 1549-8328, 10 pages.

A. Klein, Chapter 2, *Linear Feedback Shift Registers*, © 2013 Springer-Verlag, London 2013, 10.1007/978-1-4471-5079-4, 44 pages.

Bernard Widrow et al., *Adaptive Noise Cancelling: Principles and Applications*, Mar. 24, 1975, 26 pages.

* cited by examiner

SIGNAL TRANSFER FUNCTION EQUALIZATION IN MULTI-STAGE DELTA-SIGMA ANALOG-TO-DIGITAL CONVERTERS

PRIORITY DATA

This is a non-provisional patent application receiving benefit from US Provisional Patent Application, entitled, SIGNAL TRANSFER FUNCTION EQUALIZATION IN MULTI-STAGE DELTA-SIGMA ANALOG-TO-DIGITAL CONVERTERS (filed on Dec. 15, 2015, Ser. No. 62/267, 330). The US Provisional Patent Application is hereby incorporated by reference in its entirety.

TECHNICAL FIELD OF THE DISCLOSURE

The present disclosure relates generally to analog-to-digital converters (ADCs) and, more particularly, to signal transfer function equalization in multi-stage delta-sigma analog-to-digital converters (MASH ADCs).

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Typically, complex systems require a separate and expensive equalizer at the output of an analog-to-digital converter (ADC). Rather than providing a separate equalizer, the effective Signal Transfer Function (STF) of a Multi-stAge noise SHaping (MASH) ADC can be modified by leveraging available digital filtering hardware necessary for quantization noise cancellation. The modification can involves adding calculations in the software previously provided for computing digital quantization noise cancellation filter coefficients, where the calculations are added to take into account equalization as well. As a result, the signal transfer function can be modified to meet ADC or system-level signal-chain specifications without additional equalization hardware. The method is especially attractive for high-speed applications where magnitude and phase responses are more challenging to meet.

Designing Analog-to-Digital Converters

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Figure 1:
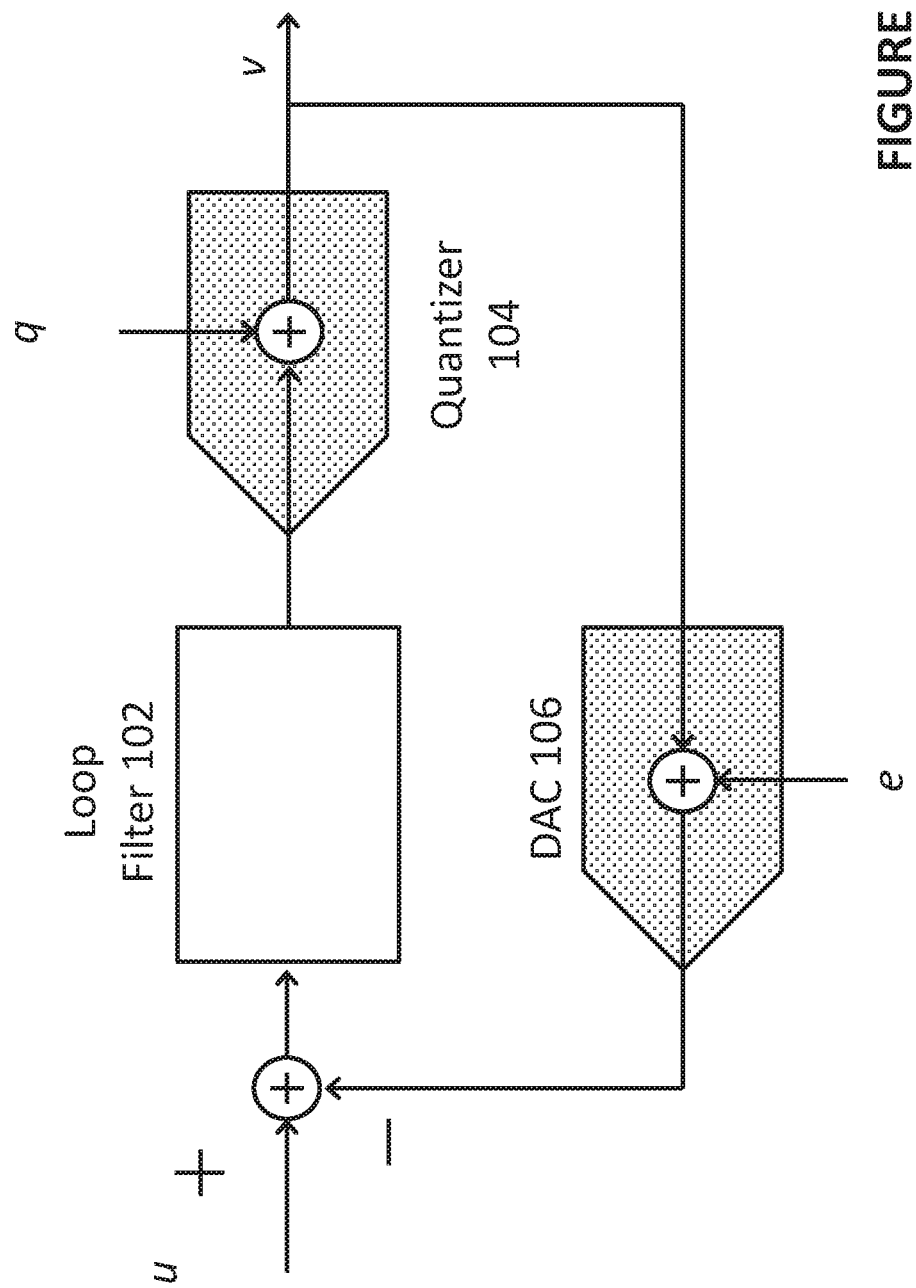
FIG. 1 is an illustrative system diagram of a delta sigma analog-to-digital converter (DS ADC)

ADCs based on delta-sigma (DS) modulation (referred to herein as "DS ADCs") have been widely used in digital audio and high precision instrumentation systems. FIG. 1 is an illustrative system diagram of a delta sigma analog-to-digital converter (DS ADC), or sometimes referred herein as a delta sigma modulator. The DS ADC includes loop filter 102, quantizer 104, and feedback digital-to-analog converter (DAC) 106 (i.e., a DAC in the feedback path of the DS ADC).

A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., Quantizer 104) to form a higher-resolution digital output. Loop filter 102, having one or more integrators, may be included to provide error feedback for the DS ADC and to help shape the noise from the quantizer 104 out of baseband to higher frequencies. The error is usually generated by taking the difference between the original analog input signal u and a reconstructed version of the original analog input signal generated using the feedback DAC 106 (where digitized signal v is converted back into an analog signal). One key characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog-to-digital conversion. Due to its popularity, many variations on the DS ADC and structures employing the DS ADC have been proposed.

Multi-Stage Noise Shaping Analog-to-Digital Converters (MASH ADCs)

Different variations on the DS ADC have been proposed to achieve various advantages suitable for a variety of systems. In some applications, DS ADCs have been adapted to meet power concerns, while some other DS ADCs have been adapted to reduce complexity. In some cases, DS ADCs have been adapted to meet precision concerns by providing increased control over errors and/or noise. For example, for applications with an emphasis on noise shaping, a higher order DS modulator may be used, i.e., more integrators and feedback paths are used in the loop filter for shaping even more of the quantization noise to high frequencies. Delta-sigma ADCs (e.g., FIG. 1) use the shaping of quantization noise combined with oversampling to trade off resolution with signal bandwidth. High-order noise shaping and multi-bit implementations allow for more aggressive tradeoffs, but at the risk of making the ADC unstable.

Multi-stage noise shaping (MASH) ADCs having multiple DS ADCs have been introduced. Generally speaking, MASH ADCs has a plurality of stages, e.g., a plurality of DS ADCs. In one example, a MASH ADC can have two stages, e.g., a front end and a back end. Each of the stages receive a respective analog input and outputs a respective digital output. In some cases, the stages receive the same analog output. In some cases, the stages receive different analog inputs. For instance, some MASH ADCs have a front-end and a back-end where inputs to each modulator differ. Some MASH ADCs have stages where the implementation of the stage may differ. MASH ADCs address the issue of unstability by relying on the cascading of individually stable delta-sigma modulators. However, MASH ADCs rely on the cancellation of quantization noise, which requires accurate matching between analog and digital transfer functions.

Generally speaking, MASH ADCs can include a plurality of stages (cascaded delta sigma modulators) for digitizing the signal and errors of the system in order to meet design requirements related to bandwidth, resolution, and the signal to noise ratios. One advantage of MASH ADCs is that the design cascades stable low-order loops while achieving the good performance of (potentially unstable) higher-order loops. In one example, the first stage generates, from the analog input signal, a digital output signal using a first ADC. The input to the quantizer in the first stage (or equivalently, the output from the first loop filter/integrator) can be subtracted from the first DAC analog output to yield the first stage quantization noise. The first stage quantization noise is digitized by the second stage. The result is that the first stage generates an analog signal representing its quantization noise, and the second stage quantizes the quantization noise of the first stage using a second ADC. The multi-stage approach allows the quantization noise to be reduced and thus allows the MASH ADC to achieve higher performance. If more stages are used, the input to the quantizer in the second stage (or equivalently, the output from the second loop filter or integrator) can be subtracted from the second DAC analog output to yield the second stage quantization noise which can be in turn quantized by a third stage. Input to the quantizer or output from the loop filter/integrator may be delayed by a delay element prior to the subtraction. The delay element can be provided match possible transconductance and group delay of a signal path used for generating the DAC analog output from the analog signal at the input of the delay element. To generate the final output of the MASH ADC, the respective outputs are combined. Effectively, the result is that the quantization noise of the first stage is suppressed by the second stage, and the quantization noise from the second stage is suppressed by the third stage (yielding the same suppression of noise as a single third-order loop, when three cascaded first-order loops are used).

Figure 2:
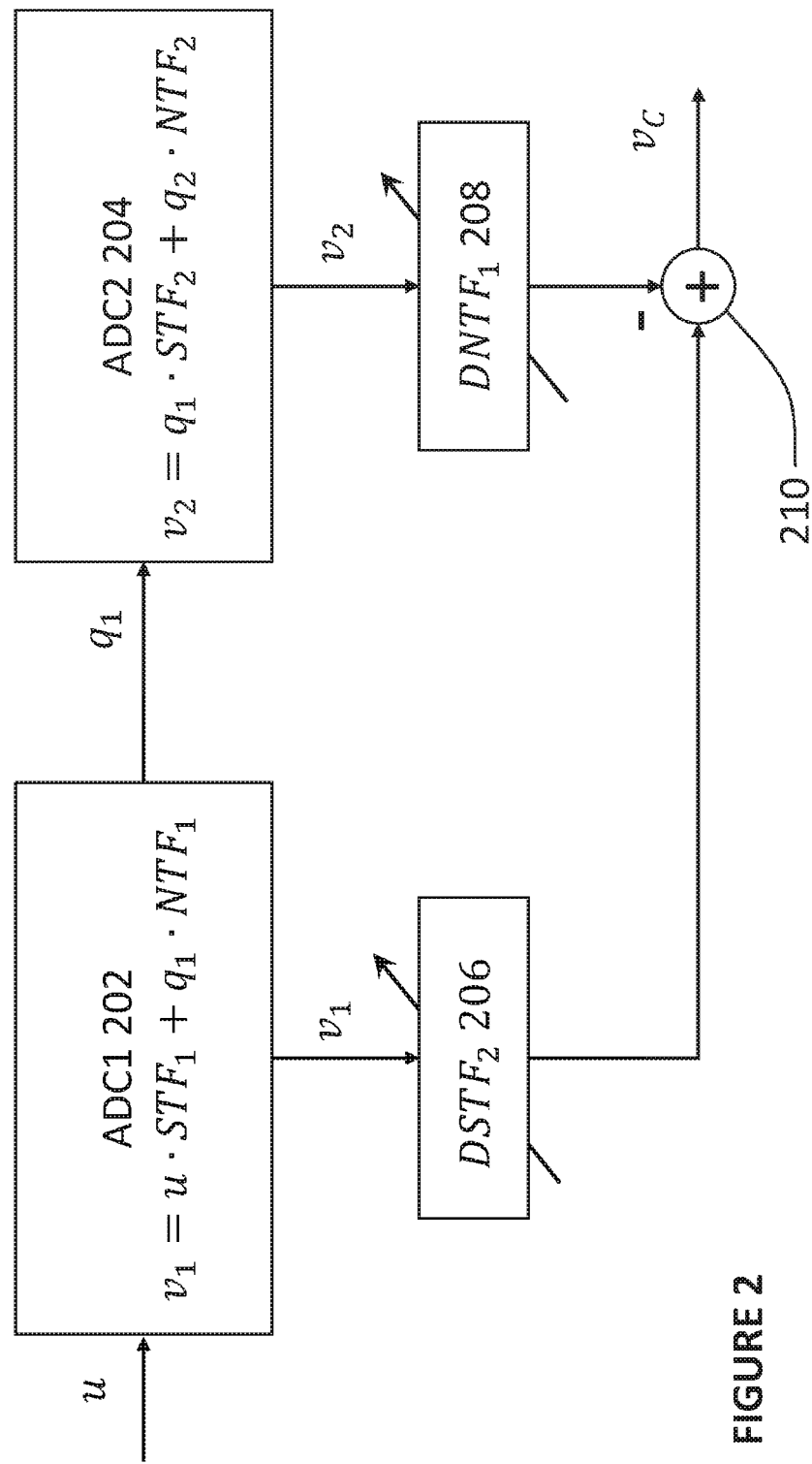
FIG. 2 shows an exemplary two-stage MASH ADC with digital quantization noise cancellation.

While providing multiple stages increases complexity and cost, MASH ADCs can achieve remarkable performance, if the cancellation of quantization noise can be properly performed. FIG. 2 shows (a high level diagram of) an exemplary two-stage MASH ADC with digital quantization noise cancellation, which can provide cancellation of quantization noise. While the example shows two stages, it is envisioned by the disclosure that digital quantization noise cancellation can be applied to MASH ADCs with more than two stages. Two ADCs, ADC1 202, and ADC2 204, are arranged in cascade, representing the ADCs in two separate stages. Each ADC has a signal transfer function (STF), $STF_1$ and $STF_2$, from its input to its output. The quantization noise q introduced by ADC1 202 appears at its output. $q_1=u-v_1$ is the quantization noise of ADC1 202; $q_2$ is the quantization noise of ADC2 204. The quantization noise is shaped by a noise transfer function (NTF) of the same stage. For instance, the quantization noise of the first stage $q_1$ is shaped by the noise transfer function of the first stage $NTF_1$. The quantization noise of the second stage $q_2$ is shaped by the noise transfer function of the second stage $NTF_2$. The transfer functions denoted by $DSTF_2$ 206 and $DNTF_1$ 208 correspond to digital implementations or estimations of their corresponding analog counterparts, $NTF_2$ and $NTF_1$. $DSTF_2$ and $DNTF_1$ are discrete-time transfer functions or equivalent discrete-time representations of continuous-time transfer functions. After the digital outputs $v_1$, $v_2$ of the two-stages are filtered by the $DSTF_2$ 206 and $DNTF_1$ 208 respectively, the digital signals are combined, e.g., by summation node 210 (or some other suitable summing circuit or adder), to generate a final digital output $v_C$.

For the two-stage MASH ADC of FIG. 2, the combined output $v_C$ is given as:

$$vc = v_1 DSTF_2 - v_2 DNTF_1 \quad (1)$$
$$= uSTF_1 DSTF_2 + q_1 (NTF_1 DSTF_2 - STF_2 DNTF_1) -$$
$$q_2 NTF_2 DNTF_1$$

If the analog and digital transfer functions are made to match perfectly, i.e., if $DSTF_2=STF_2$ and $DNTF_1=NTF_1$ the above expression simplifies to:

$$vc = uSTF_1 DSTF_2 - q_2 NTF_2 DNTF_1 \quad (2)$$

Therefore, the quantization noise from the first stage $q_1$ is cancelled out (no longer appears in the combined output $v_c$) by means of providing the digital filters $DSTF_2$ 206 and $DNTF_1$ 208 filtering the digital outputs $v_1$, $v_2$ of the two-stages respectively. The quantization noise from the second stage $q_2$ is shaped by the product of the two noise transfer functions (i.e., $NTF_2 DNTF_1$). If the analog and digital transfer functions do not match, the quantization noise from the first stage would appear at the combined output shaped by the $(NTF_1 DSTF_2 - STF_2 DNTF_1)$ term. This undesirable effect is called quantization noise leakage, and can significantly degrade the achievable Signal-to-Noise Ratio (SNR) performance of the ADC.

Various techniques have been explored to reduce quantization noise leakage. In some cases, the analog transfer functions can be made as accurate and predictable as possible, but this approach is only possible for certain low speed implementations using switched-capacitor circuits (discrete time implementations). A more effective technique is to design lower-performance analog circuits, estimate what their real/actual signal and noise transfer functions are, and compensate for their shortcomings with programmable digital filters (as shown by the arrows for $DSTF_2$ 206 and $DNTF_1$ 208 filters of FIG. 2). This technique works well as long as the analog circuits are sufficiently linear and are time invariant. The estimation of transfer function impulse responses may be performed in the background by cross-correlating the ADC outputs with a known random signal injected at the quantizer of the first stage, or in the foreground by injecting known signals. The programmable digital filters or cancellation filters can be implemented as programmable finite-impulse response (FIR) filters.

Having Separate Equalization at the Output of the ADC can be Costly

Figure 3:
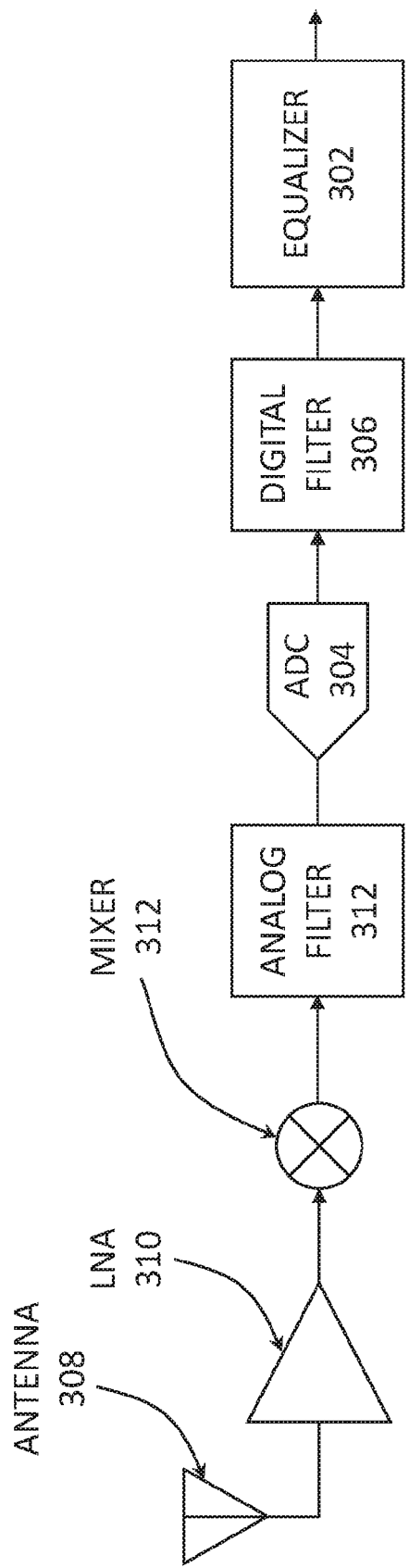
FIG. 3 is a wireless receiver system having a separate equalizer at the output of the ADC.

In complex systems such as those found in wireless receivers, an equalizer is typically required to ensure that the signal-path frequency and phase responses meet system-level target specifications. FIG. 3 is a wireless receiver system having a separate equalizer 302 downstream from the ADC 304 and digital filter 306. The wireless receiver system can include an antenna 308 for receiving a signal, a low noise amplifier (LNA) 310, The equalizer 302 compensates for distortions in the response introduced by the various signal processing blocks in the receiver signal path. Equalizers may also be required in less complex applications, such as for receivers where ADCs therein do not have a flat signal transfer function or linear phase response. For example, a continuous-time delta-sigma modulator may show undesirable effects in its signal transfer function (STF) (e.g., peaking at some frequencies). An equalizer like equalizer 302 may be added as a separate component to equalize the signal transfer function.

Combining Digital Quantization Noise Cancellation with Equalization in a Single Digital Filter As explained above, an equalizer may be required in a system for correction of any signal transfer function magnitude or phase (and indirectly, group delay) response issues. If such a system includes a MASH ADC as part of its signal path (as the ADC), then the digital quantization noise cancellation described above may be extended to implement the equalization filter as well. The extension involves a software-based modification to the hardware digital filters are already included in the system to provide digital quantization noise cancellation. Accordingly, equalization can be implemented at no extra hardware cost. Even if a separate equalizer is provided in the signal chain, the requirements of the equalizer can be relaxed.

Figure 4B:
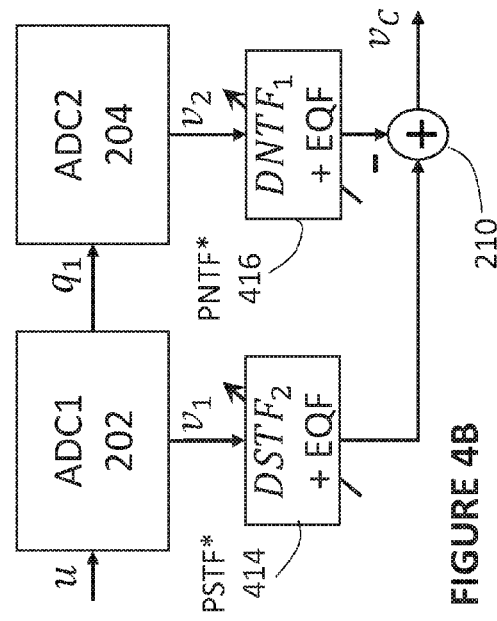
FIG. 4B shows an exemplary two-stage MASH ADC with digital quantization noise cancellation and equalization, according to some embodiments of the disclosure.
Figure 4A:
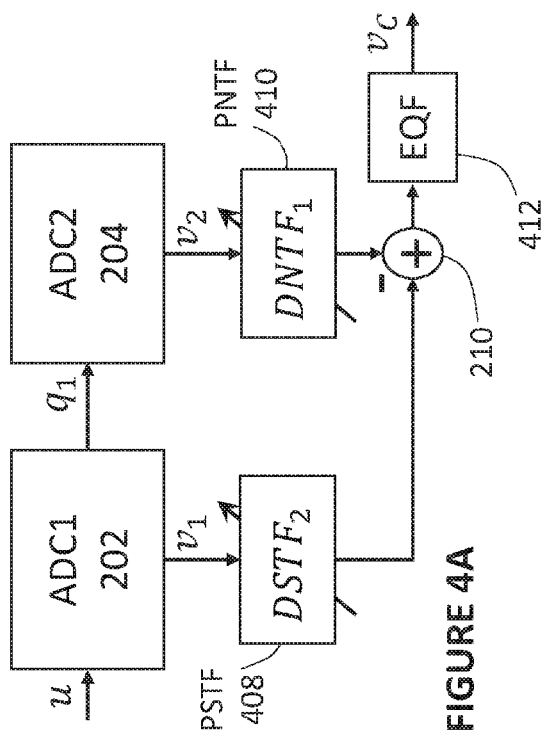
FIG. 4A shows an exemplary two-stage MASH ADC with digital quantization noise cancellation.

FIG. 4A shows an exemplary two-stage MASH ADC with digital quantization noise cancellation, similar to FIG. 2. Note that the equalization filter EQF 412 is applied at the final output $v_C$ of the MASH ADC or downstream from the final output of the MASH ADC. PSTF 408 is a programmable STF filter, implementing $DSTF_2$. PNTF 410 denotes a programmable NTF filter implementing $DNTF_1$. The programmable STF filter $DSTF_2$ aims to match the actual STF of the second stage; the programmable NTF filter $DNTF_1$ aims to match the actual noise transfer function of the first stage.

With modification, the digital filters originally implementing $DSTF_2$ and $DNTF_1$ to provide digital quantization noise cancellation can be updated to also implement equalization. FIG. 4B shows an exemplary two-stage MASH ADC with combined digital noise cancellation and equalization, according to some embodiments of the disclosure. The updated filter PSTF* 414, now implements both $DSTF_2$ and EQF (short for equalization filter), and the updated filter PNTF* 416 implements $DNTF_1$ and EQF. Combining the digital quantization noise cancellation filters with the equalization filters is not trivial. The updated digital filter has to be determined properly for each of the filters, e.g., $DSTF_2$+ EQF and $DNTF_1$+EQF. Notably, these filters are applied to $v_1$ and $v_2$ prior to the combination of the two filtered signals (shown as the addition/subtraction block) forming the final output of the MASH ADC $v_C$. This is in contrast to adding a separate additional equalization filter to the output of the MASH ADC $v_C$ (as illustrated by FIG. 4A).

Method for Generating the Combined Digital Filters

Figure 5:
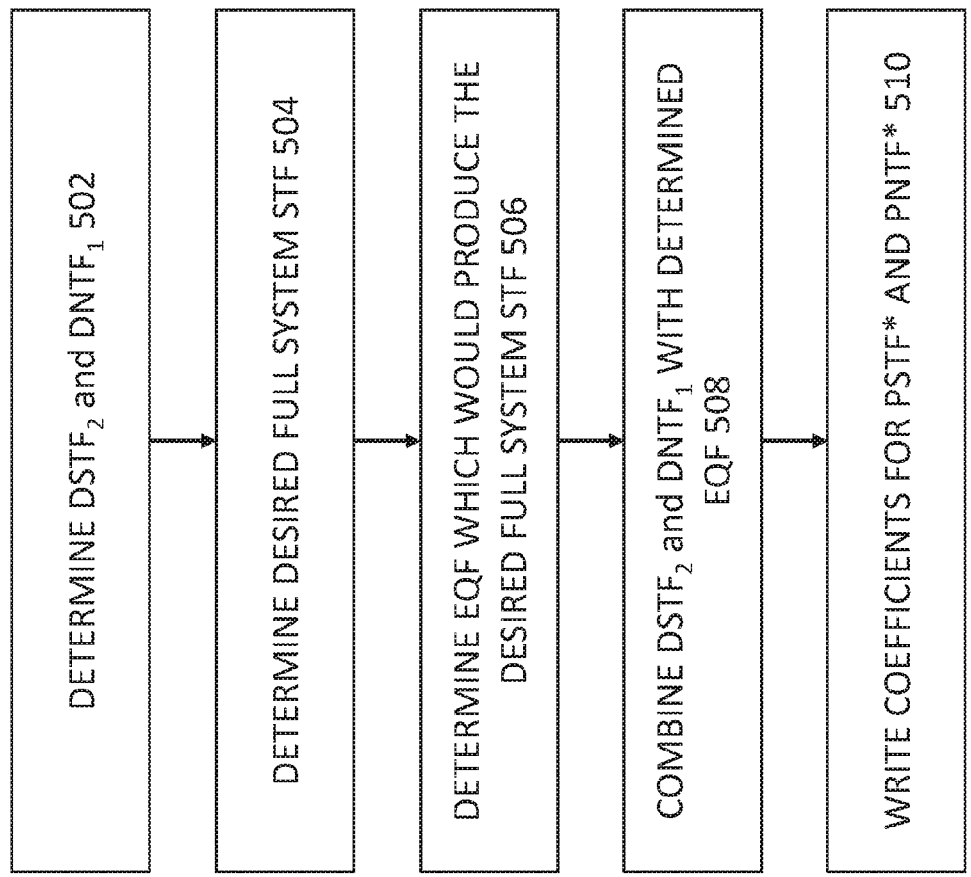
FIG. 5 shows an exemplary method for generating digital noise quantization cancellation and equalization filters, according to some embodiments of the disclosure.

FIG. 5 shows an exemplary method for generating digital noise cancellation and equalization filters, according to some embodiments of the disclosure. The method for combining the noise cancellation filter and equalization filter includes several parts. The method is described in relation to the two-stage MASH ADC shown in FIG. 4B, but other MASH ADCs having more stages can also leverage this method. Circuitry and systems illustrated in FIGS. 4B and 11 can implement the method illustrated by FIG. 5.

In 502 (illustrated by FIG. 2 and its accompanying description), the digital signal transfer function of the second stage $DSTF_2$ and the digital noise transfer function of the first stage $DNTF_1$ are determined. The digital transfer functions estimates the actual transfer functions. Preferably, $DSTF_2$ and $DNTF_1$ are determined to match or estimate the analog counterparts (i.e., $DNTF_1=NTF_1$ and $DSTF_2=STF_2$) so that the digital filters can achieve full cancellation of the first-stage quantization noise $q_1$.

In 504, the desired ADC or full system signal transfer function (STF) is determined from target specifications (which can vary depending on the application). For instance, the full system STF can be expressed as an impulse response. If a linear phase response is desired, the STF can be determined to guarantee that property (e.g., its coefficients should be symmetric or antisymmetric).

In 506, an equalization filter response (EQF) is determined. Preferably, when the EQF is cascaded with other parts of the signal path ($STF_1$, $DSTF_2$, and if applicable, other filters internal to external to the ADC), the determined EQF would produce the desired full system STF.

In 508, based on the determined $DSTF_2$, $DNTF_1$, and EQF, the $DSTF_2$ is combined with EQF as a new digital filter and $DNTF_1$ is combined with EQF as another new digital filter. The new digital filter coefficients are determined to ensure the desired full system STF is achieved while maintaining the noise cancellation function.

Figure 11:
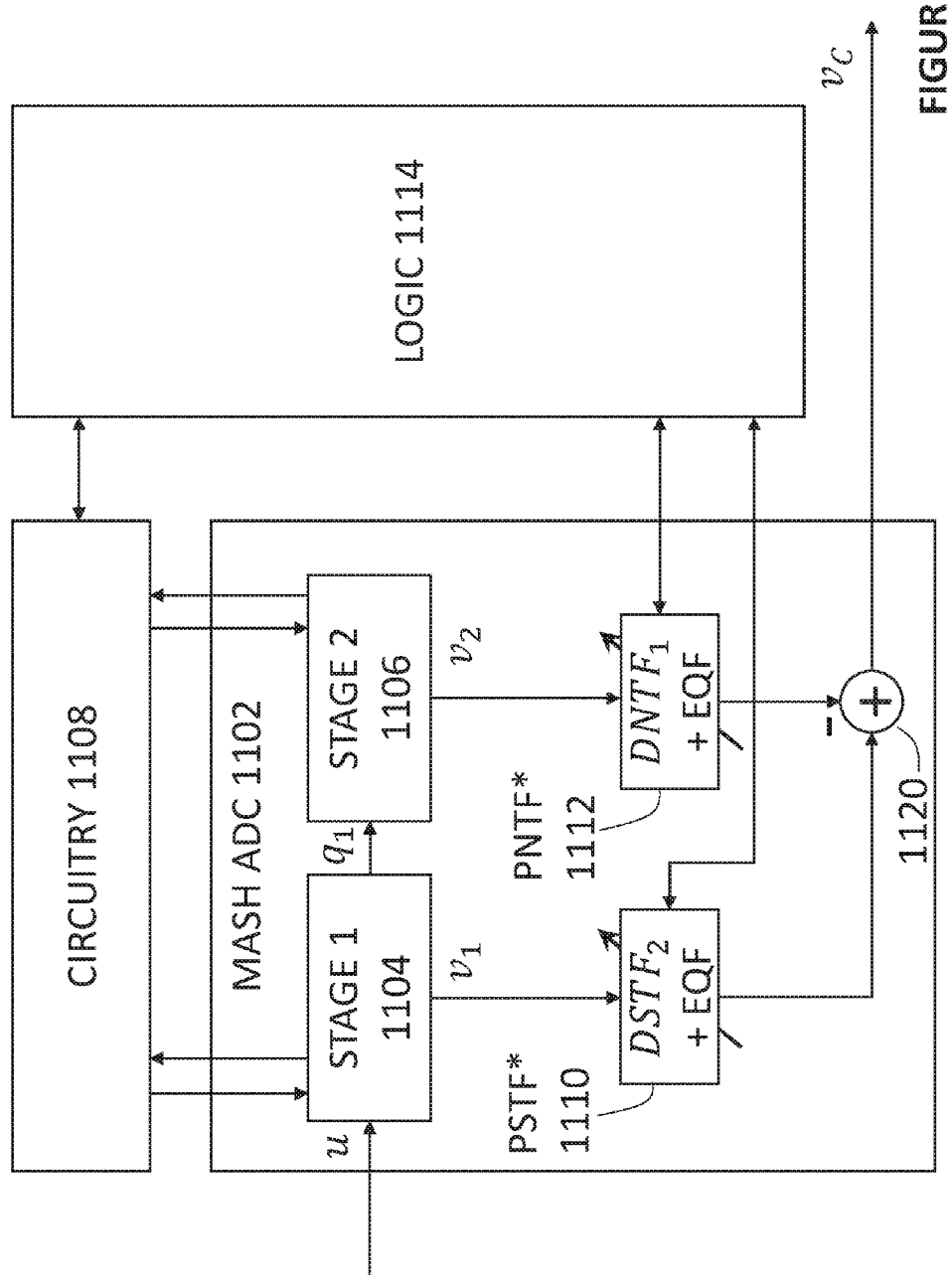
FIG. 11 shows an exemplary method for digital noise quantization cancellation and equalization, according to some embodiments of the disclosure.

In 510, the determined digital filter coefficients are written to the two programmable digital filters PSTF* 414 and PNTF* 416 as seen in FIG. 4B, or PSTF* 1110 and PNTF* 1112 as seen in FIG. 11.

Exemplary Calculations for New Digital Filters PSTF* and PNTF*

The following example illustrates a possible methodology to calculate the response of the programmable digital filters PSTF* and PNTF* so that the programmable digital filters can achieve both quantization noise cancellation and signal path equalization. The example is described with respect to the two-stage MASH ADC illustrated in FIG. 4B or the two-stage MASH ADC illustrated in FIG. 11. In this particular example, the two-stage MASH ADC was designed to have the following ideal $STF_1$ and $NTF_1$ for the first stage and $STF_2$ for the second stage:

$$STF_1 = 1 + z^{-1}$$

$$NTF_1 = 1 - z^{-1}$$

$$STF_2 = 1 + 0.6 z^{-1} \quad (3)$$

Figure 6:
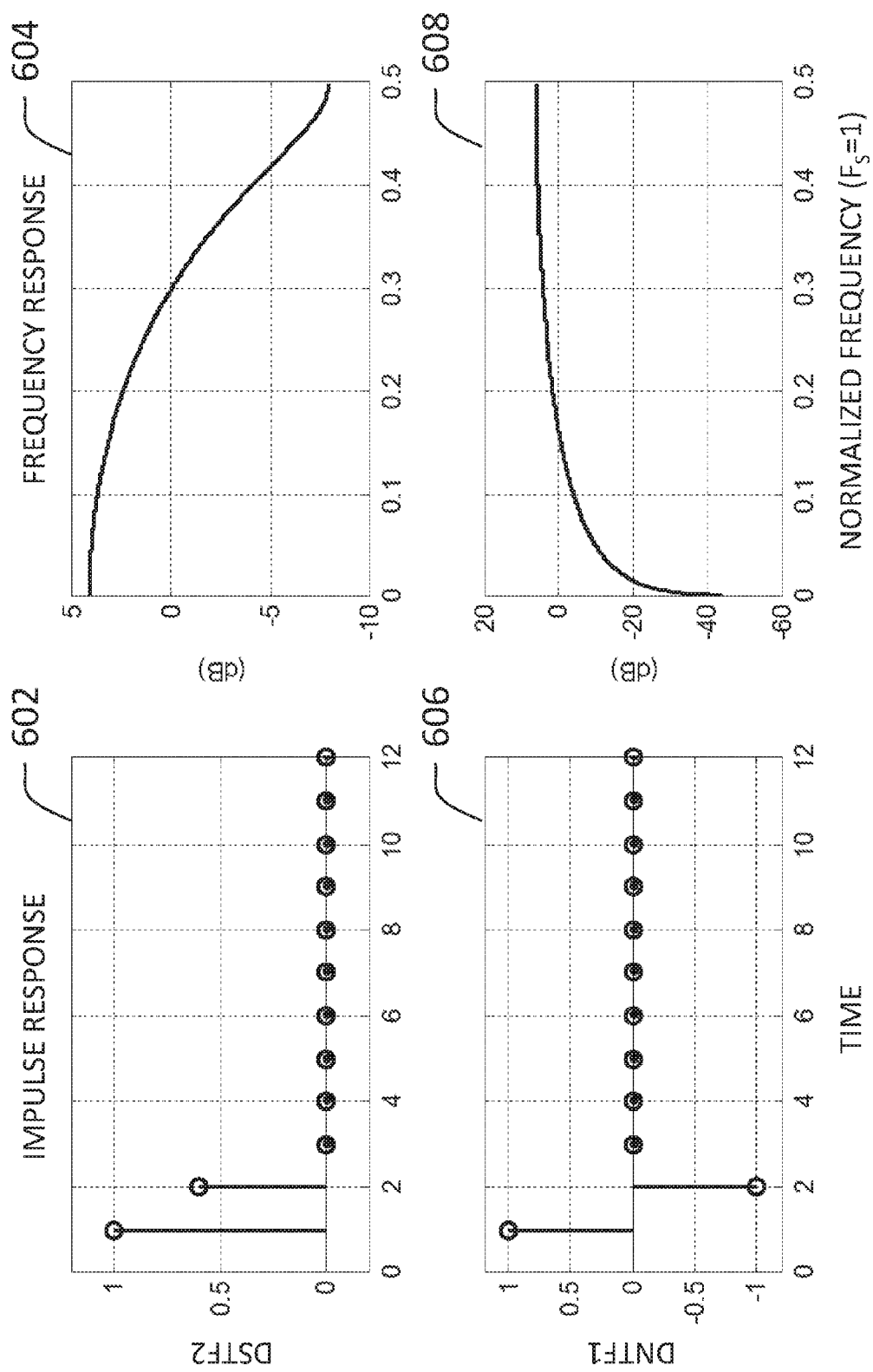
FIG. 6 shows exemplary DSTF2 and DNTF1 examples, according to some embodiments of the disclosures.

After an estimation process (502 of FIG. 5), the corresponding digital transfer functions $DSTF_2$ and $DNTF_1$ are determined. FIG. 6 shows exemplary $DSTF_2$ and $DNTF_1$, according to some embodiments of the disclosures. The impulse response of $DSTF_2$ is shown in plot 602. The frequency response of $DSTF_2$ is shown in plot 604. The impulse response of $DNTF_1$ is shown in plot 606. The frequency response of $DNTF_1$ is shown in plot 608. For simplicity, the $STF_2$ and $NTF_1$ transfer functions are assumed to ideal and thus the $DSTF_2$ and $DNTF_1$ matches the equations for the analog counterparts (Equation set (3)).

Suppose the desired full-system STF response STF(z) is determined to be $0.25 + 0.5z^{-1} + 0.25\, z^{-2}$ (504 of FIG. 5), which corresponds a well-behaved low-pass filter response. The equalization filter response EQF, that, e.g., when cascaded with $STF_1$ and $DSTF_2$, achieving the desired full system STF response. In mathematical terms, $EQF(z) \cdot STF1(z) \cdot DSTF2(z) = STF(z)$. Therefore, EQF(z) can be determined from the following equation (506 of FIG. 5):

$$pstf^*(n) = dstf2 \otimes eqf = \sum_{k=0}^{N-1} dstf2[k] eqf[n-k] \quad (5)$$

$$pntf^*(n) = dntf1 \otimes eqf = \sum_{k=0}^{N-1} dntf1[k] eqf[n-k] \quad (6)$$

Figure 7:
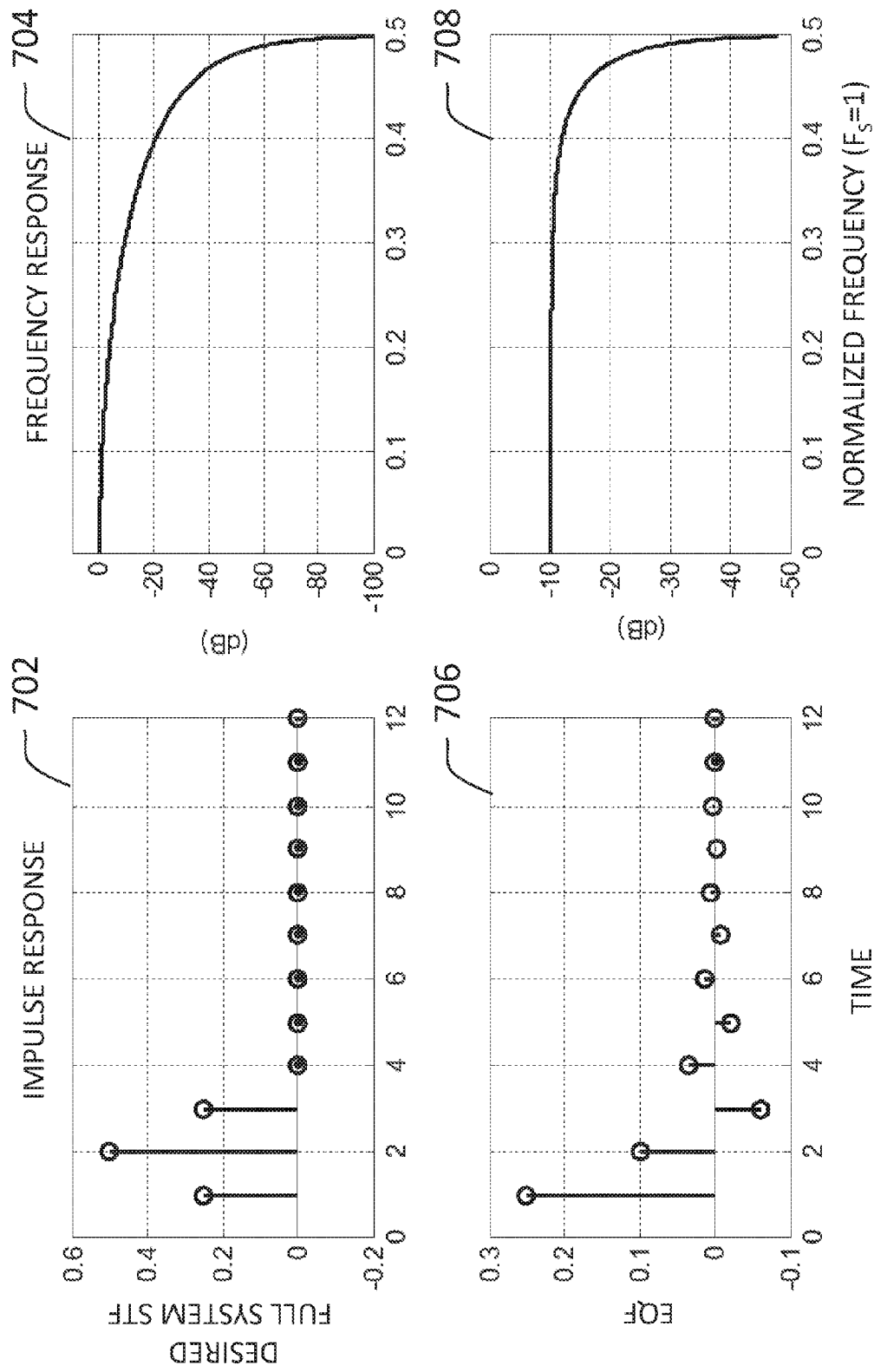
FIG. 7 shows desired STF and the equalizer response that achieves the desired STF, according to some embodiments of the disclosure.

FIG. 7 shows desired full system STF(z) and the equalizer response EQF(z) that achieves the desired STF, according to some embodiments of the disclosure. The impulse response and frequency response of the desired full system STF are shown in plots 702 and 704 respectively. The impulse response and frequency response of the EQF which achieves the full system STF response are shown in plots 706 and 708 respectively. Since the combined noise-cancellation and equalization responses are intended to be implemented as FIR filters, result of EQF(z) from Equation (4) can be converted to an impulse response. This can be done by calculating the behavior of the filter when an impulse is applied to its input.

To combine the $DSTF_2$ and $DNTF_1$ with the EQF determined above, the responses can be convolved together (508 of FIG. 5), in the time domain:

$$EQF(z) = \frac{STF(z)}{STF1(z) \cdot DSTF2(z)} \quad (4)$$

Convolution combines the responses $DSTF_2$ and EQF, and also combines the responses $DNTF_1$ and EQF, so that new digital filters PSTF* and PNTF* seen in FIG. 4B can be determined, i.e., filter coefficients can be determined. Accordingly, with the new coefficients can be implemented by the programmable digital filters. Equivalently, the responses can be multiplied with each other in the frequency domain for the same result.

Figure 8:
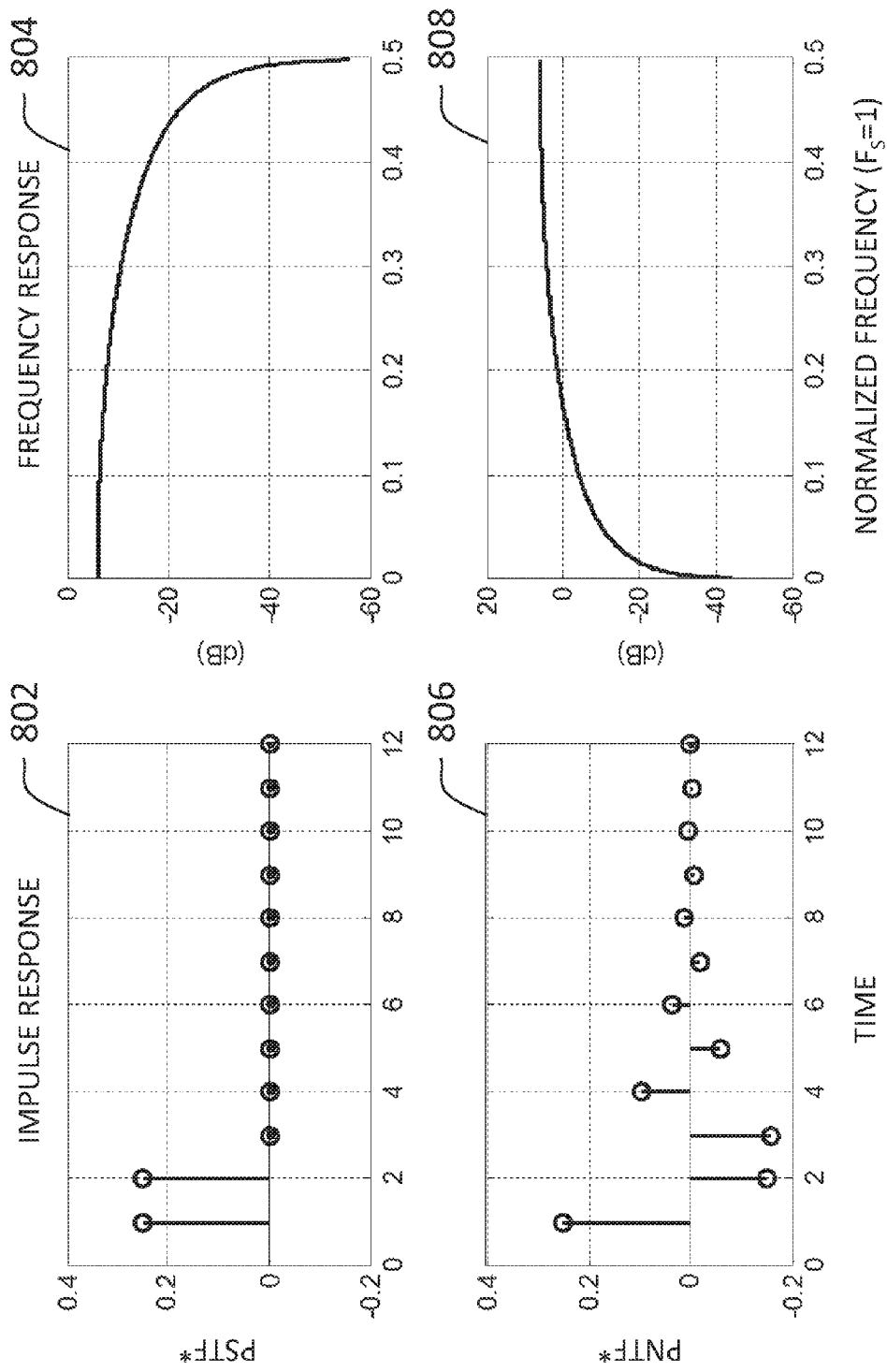
FIG. 8 shows exemplary programmable filter responses, according to some embodiments of the disclosure.

FIG. 8 shows exemplary programmable filter responses, according to some embodiments of the disclosure. The impulse response and the frequency response of the digital filter PSTF* are shown in plots 802 and 804 respectively. The impulse response and the frequency response of the digital filter PNTF* are shown in plots 806 and 808 respectively. The new coefficients for the digital filters PSTF* and PNTF* can be written to the programmable filters (510 of FIG. 5). For this example, the number of taps in each of the programmable filters is 12 (this is N in Equations (5) and (6)). Using these programmable digital filters PSTF* and PNTF*, the resulting full system STF can match the desired STF exactly while maintaining the quantization noise cancellation function.

Figure 9:
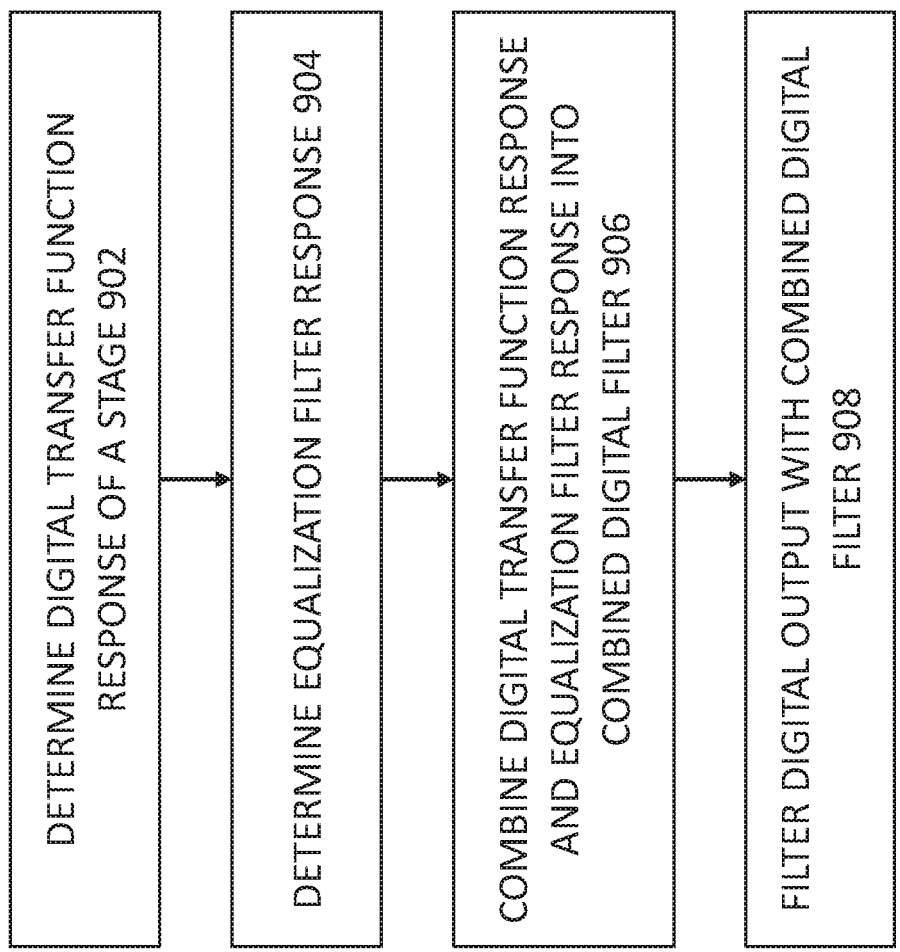
FIG. 9 shows an exemplary method for digital noise quantization cancellation and equalization, according to some embodiments of the disclosure.

Exemplary Methods and Apparatuses for Combined Digital Noise Quantization Cancellation and Equalization FIG. 9 shows an exemplary method for digital noise quantization cancellation and equalization for a system having MASH ADC, according to some embodiments of the disclosure. The method is similar to the method illustrated by FIG. 5, and the scheme illustrated by FIGS. 6-8. Circuitry and systems illustrated in FIGS. 4B and 11 can implement the method illustrated by FIG. 9.

In 902, digital transfer function response of a particular stage in the MASH ADC is determined. In some embodiments, the digital transfer function of a particular stage is a digital signal transfer function estimating an actual signal transfer function of the particular stage. For instance, the digital transfer function is the digital signal transfer function of the second stage $DSTF_2$ estimating the actual signal transfer function of the second stage $STF_2$. In some embodiments, the digital transfer function of a particular stage is a digital noise transfer function estimating an actual noise transfer function of the particular stage. For instance, the digital transfer function is a digital noise transfer function of the first stage $DNTF_1$ estimating the actual noise transfer function of the first stage $NTF_1$. Preferably, $DSTF_2$ and $DNTF_1$ are determined to match the analog/actual counterparts (i.e., $DNTF_1=NTF_1$ and $DSTF_2=STF_2$) so that the digital filters can achieve full cancellation of the first-stage quantization noise $q_1$. The determination of digital transfer function responses may be performed in the background by cross-correlating the ADC outputs with a known random signal injected at the quantizer of the first stage, or in the foreground by injecting known signals.

In 904, an equalization filter response EQF is determined. The equalization filter response corresponds to an equalization filter response that achieves a desired full system STF response. The method can further include determining a desired signal transfer function response for the system having the MASH ADC, which can differ depending on the application. Determining the equalization filter response can include determining the equalization filter response based on the desired signal transfer function response (desired full system STF) and transfer functions in a signal path of the MASH ADC. This operation is illustrated by equation (4). The desired signal transfer function response is a desired full system STF is shown as STF(z), and the transfer functions in the signal path of the MASH ADC is shown as STF1(z)·DSTF2(z) (e.g., (actual) signal transfer function of the first stage, and estimated/digital signal transfer function of the second stage). If there are three stages in the signal path of the MASH ADC, the equation for finding the equalization function response would be: EQF(z)=STF(z)/(STF1(z)*DSTF2(z)*DSTF3(z)).

In 906, the digital transfer function response (from 902) and the equalization filter response EQF (from 904) are combined into a combined or merged digital filter. The combination operation is illustrated by FIGS. 5-8 and their accompanying description. For instance, the combined/merged digital filter can combine $DSTF_2$ and EQF. In another instance, the combined/merged digital filter can combine $DNTF_1$ and EQF. In the frequency domain, combining the digital transfer function response and the equalization filter response may be a multiplication of the two responses to obtain the combined or merged digital filter. In the time domain, combining the digital transfer function response and the equalization filter response comprises convolving the digital transfer function response with the equalization filter response to determine filter coefficients of the combined/merged digital filter (illustrated by equations (5) and (6)). The results from 906 can include filter coefficients for programmable filters PSTF* and PNTF* of FIGS. 4B and 11. The method can further include writing filter coefficients of the combined digital filter to a programmable finite impulse response filter.

In 908, the combined digital filter filters a digital output of a different stage in the MASH ADC. The combined digital filter filters the digital output prior to combining a result from the combined digital filter with other results from other stages of the MASH ADC. In other words, the combined digital filter can be placed upstream from a summation node which combines results of the stages in the MASH ADC. For instance, as illustrated by FIGS. 4B and 11, programmable filter PSTF*, which combines $DSTF_2$ and EQF, can filter the output of the first stage $v_1$. In another instance, programmable filter PNTF*, which combines $DNTF_1$ and EQF, can filter the output of the second stage $v_2$. Outputs of the programmable filters are subsequently combined by summation node 210 or 1120. This filtering architecture is distinctly different from the one using a separate equalizer (downstream from the summation node) seen in FIGS. 3 and 4A.

Figures 10A, 10B, 10C:
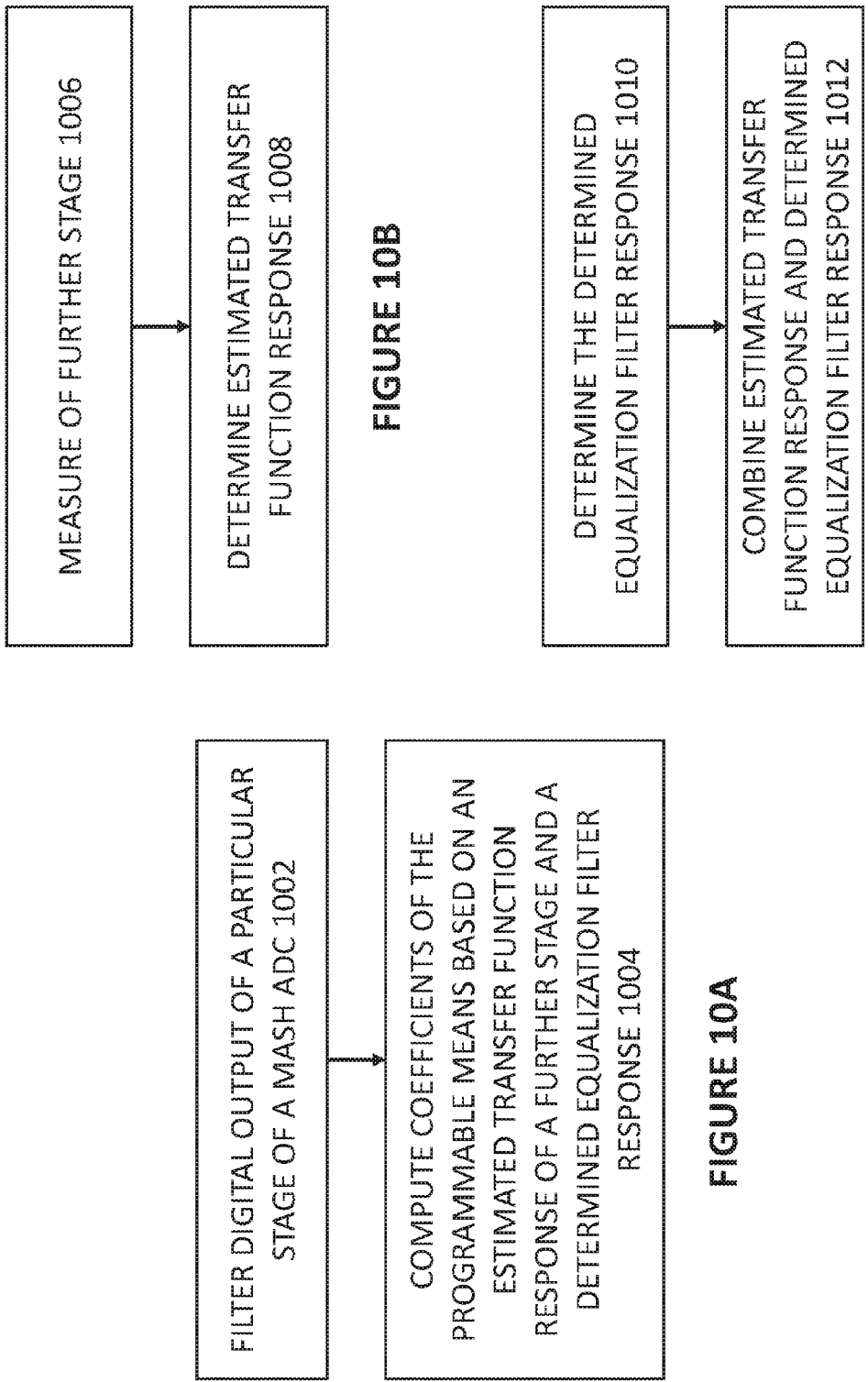
FIGS. 10A-C show methods for digital noise quantization cancellation and equalization, according to some embodiments of the disclosure.

FIGS. 10A-C show methods for digital noise quantization cancellation and equalization, according to some embodiments of the disclosure. The method is similar to the method illustrated by FIG. 5, and the scheme illustrated by FIGS. 6-8. Circuitry and systems illustrated in FIGS. 4B and 11 can implement the methods illustrated by FIGS. 10A-C. The circuitry and systems would generally include a multi-stage noise shaping analog-to-digital converter (MASH ADC).

In 1002, programmable means may filter a digital output of a particular stage of the MASH ADC. Examples include programmable filters PSTF* and PNTF* of FIG. 4B and FIG. 11, for filtering the digital output $v_1$ of the first stage and the digital output $v_2$ of the second stage respectively. For instance, the programmable means may include a programmable digital filter, or programmable finite impulse response filter having a suitable number of taps.

In 1004, coefficients of the programmable means are computed, e.g., by digital means, based on an estimated transfer function response of a further stage of the MASH ADC (e.g., $DSTF_2$ and $DNTF_1$) and a determined equalization filter response.

FIG. 10B illustrates how to determine the estimated transfer function. In 1006, the further stage of MASH ADC is measured. In 1008, the estimated transfer function response, which estimates an actual signal transfer function of the further stage of MASH ADC, is determined from the measurements. Process for measuring and estimating the responses are explained in relation to FIG. 2. Preferably, estimated transfer functions such as $DSTF_2$ and $DNTF_1$ are determined to match the analog/actual counterparts (i.e., $DNTF_1=NTF_1$ and $DSTF_2=STF_2$) so that the digital filters can achieve full cancellation of the first-stage quantization noise $q_1$. The determination of digital transfer function responses may be performed in the background by cross-correlating the ADC outputs with a known random signal injected at the quantizer of the first stage, or in foreground by injecting known signals.

FIG. 10C illustrates details of 1004. Computing coefficients of the programmable filter can include 1010, where the determined equalization filter response is determined from a desired signal transfer function response of the system and transfer functions in a signal path of the MASH ADC (illustrated by equation (4)), and 1012, where the estimated transfer function response of the further stage of the MASH ADC and the determined equalization filter response are combined (illustrated by equations (5) and (6)).

Exemplary System Having Combined Digital Noise Quantization Cancellation and Equalization FIG. 11 shows an exemplary system having digital noise quantization cancellation and equalization, according to some embodiments of the disclosure. The system can implement the methods described herein. The system includes MASH ADC 1102 having at least two stages, comprising at least a first stage (stage 1 1104) and a subsequent second stage (stage 2 1106). Digital outputs of the stage 1 1104 and the stage 2 1106 are combined by a summation node 1120 (e.g., suitable summation circuitry, or adder).

The system further includes circuitry 1108 for estimating a transfer function response of a particular stage of the MASH ADC. In some embodiments, the particular stage is the subsequent second stage in the MASH ADC (stage 2 1106), and the circuitry 1108 for estimating the transfer function response comprises circuitry for making measurements of the subsequent second stage of MASH ADC and determining a digital signal transfer function response ($DSTF_2$) as the estimated transfer function response, which estimates an actual signal transfer function of the subsequent second stage of MASH ADC ($STF_2$), from the measurements. In some embodiments, the particular stage is the first stage in the MASH ADC (stage 1 1104), and the circuitry 1108 for estimating the transfer function response comprises circuitry for making measurements of the first stage of MASH ADC and determining a digital noise transfer function response ($DNTF_1$) as the estimated transfer function response, which estimates an actual noise transfer function of the first stage of MASH ADC ($NTF_1$), from the measurements. In some examples, the circuitry 1108 can estimate of transfer function impulse responses in the background by cross-correlating the ADC outputs with a known random signal injected at the quantizer of the first stage, or in the foreground by injecting known signals.

The system further includes a programmable filter for filtering a further stage of the MASH ADC. The programmable filter can include PSTF* 1110. The programmable filter can include PNTF*1112. The programmable filter processes a digital output (e.g., $v_1$, $v_2$) generated by the other stage prior to combining results from the stages of the MASH ADC for a final digital output (e.g., $v_c$). The programmable filter can be a programmable finite impulse response filter.

The system further includes logic 1114, e.g., digital processing logic or circuitry, for computing coefficients of the programmable filter based on the estimated transfer function response and a determined equalization filter response. The logic for computing coefficients of the programmable filter can include logic for determining the determined equalization filter response from a desired signal transfer function response of the system and transfer functions in a signal path of the MASH ADC. This operation is illustrated by equation (4). The logic for computing coefficients of the programmable filter can include combining the estimated transfer function response and the determined equalization filter response into a single digital filter. This operation is illustrated by equations (5) and (6). Logic 1114 or the system can include logic for writing the computed coefficients to the programmable finite impulse response filter.

Examples

Example 1 is a method for digital quantization noise cancellation and equalization for a system having a multi-stage noise shaping analog-to-digital converter (MASH ADC), the method comprising: determining a digital transfer function response of a particular stage in the MASH ADC, determining an equalization filter response, combining the digital transfer function response and the equalization filter response into a combined digital filter.

In Example 2, any one of the above examples can further include filtering, by the combined digital filter, a digital output of a different stage in the MASH ADC.

In Example 3, any one of the above examples can further include the digital transfer function of the particular stage being a digital signal transfer function estimating an actual signal transfer function of the particular stage.

In Example 4, any one of the above examples can further include the digital transfer function of the particular stage being a digital noise transfer function estimating an actual noise transfer function of the particular stage.

In Example 5, any one of the above examples can further include determining a desired signal transfer function response for the system having the MASH ADC.

In Example 6, any one of the above examples can further include determining the equalization filter response comprising determining the equalization filter response based on a desired signal transfer function response and transfer functions in a signal path of the MASH ADC.

In Example 7, any one of the above examples can further include combining the digital transfer function response and the equalization filter response comprising convolving the digital transfer function response with the equalization filter response in a time domain to determine filter coefficients of the combined digital filter.

In Example 8, any one of the above examples can further include writing filter coefficients of the combined digital filter to a programmable finite impulse response filter.

Example 9 is system having digital quantization noise cancellation and equalization, the system comprising: multi-stage noise shaping analog-to-digital converter (MASH ADC), circuitry for estimating a transfer function response of a particular stage of the MASH ADC, a programmable filter for filtering a further stage of the MASH ADC, and logic for computing coefficients of the programmable filter based on the estimated transfer function response and a determined equalization filter response.

In Example 10, any one of the above examples can further include the MASH ADC being a continuous-time MASH ADC.

In Example 11, any one of the above examples can further include the MASH ADC comprising at least a first stage and a subsequent second stage, the particular stage being the subsequent second stage in the MASH ADC, and the circuitry for estimating the transfer function response comprising circuitry for making measurements of the subsequent second stage of MASH ADC and determining a digital signal transfer function response as the estimated transfer function response, which estimates an actual signal transfer function of the subsequent second stage of MASH ADC, from the measurements.

In Example 12, any one of the above examples can further include the MASH ADC comprising at least a first stage and a subsequent second stage, the particular stage being the first stage in the MASH ADC, and the circuitry for estimating the transfer function response comprising circuitry for making measurements of the first stage of MASH ADC and determining a digital noise transfer function response as the estimated transfer function response, which estimates an actual noise transfer function of the first stage of MASH ADC, from the measurements.

In Example 13, any one of the above examples can further include the programmable filter processing a digital output generated by the other stage prior to combining results from the stages of the MASH ADC for a final digital output.

In Example 14, any one of the above examples can further include the logic for computing coefficients of the programmable filter comprising logic for determining the determined equalization filter response from a desired signal transfer function response of the system and transfer functions in a signal path of the MASH ADC.

In Example 15, any one of the above examples can further include the logic for computing coefficients of the programmable filter comprising combining the estimated transfer function response and the determined equalization filter response into a single digital filter.

In Example 16, any one of the above examples can further include the programmable filter being a programmable finite impulse response filter.

In Example 17, any one of the above examples can further include logic for writing the computed coefficients to the programmable finite impulse response filter.

Example 18 is an apparatus having digital quantization noise cancellation and equalization, the apparatus comprising: multi-stage noise shaping analog-to-digital converter (MASH ADC), programmable means for filtering a digital output of a particular stage of the MASH ADC, means for computing coefficients of the programmable means based on an estimated transfer function response of a further stage of the MASH ADC and a determined equalization filter response.

In Example 19, any one of the above examples can further include means for measuring of the further stage of MASH ADC, means for determining the estimated transfer function response, which estimates an actual signal transfer function of the further stage of MASH ADC, from the measurements.

In Example 20, any one of the above examples can further include means for computing coefficients of the programmable filter comprising means for determining the determined equalization filter response from a desired signal transfer function response of the system and transfer functions in a signal path of the MASH ADC, and means for combining the estimated transfer function response of the further stage of the MASH ADC and the determined equalization filter response.

Other Implementation Notes, Variations, and Applications

The width of radio frequency (RF) bands commonly used for cellular telecommunications has grown from 35-75 MHz for 2G/3G/4G platforms to 100-200 MHz for today's Long Term Evolution (LTE) and the desire for relaxed image rejection filtering has pushed the direct intermediate frequency (IF) sampling frequencies to 300+MHz. In some embodiments, the digital quantization noise cancellation and equalization features can be used in a continuous-time (CT) multi-stage noise-shaping (MASH) ADC integrated circuit which achieves 69 dB of DR over a 465 MHz signal bandwidth with a combined power consumption of 930 mW from ±1.0V/1.8V supplies. The ADC integrated circuit can be implemented in 28 nm CMOS and achieves a peak SNDR of 64 dB, a small-signal noise-spectral density (NSD) of −156 dBFS/Hz, and a figure-of-merit (FOM) of 156 dB over a signal bandwidth of 465 MHz. With an 8 GHz sample rate and a signal bandwidth of 465 MHz, the oversampling ratio (OSR) is 8.6. A 1-2 MASH architecture can be chosen to achieve aggressive noise-shaping at a low OSR. The use of low-order sub-loops also contributes to the robustness of the overall ADC. The first stage can be a first-order modulator to minimize the power of amplifiers for a given thermal noise requirement under a low OSR scenario. The first stage can include an active-RC integrator, a 17-level flash ADC (FLASH1), a current-steering DAC (IDAC1), and a capacitive-DAC (CDAC1). CDAC1 implements a fast direct-feedback (DFB) loop to compensate for the excess loop delay associated with the chosen FLASH-IDAC timing. A differential 200Ω R1U and a 625 uA IDAC1 LSB can set a 2V differential p-p input full-scale. A dither block adds a 1-bit ½-LSB dither signal to the output of FLASH1. The quantization residue of the first-stage is injected into the second-stage via R21 and current-steering DAC (IDAC2A). R21 is implemented as an all-pass RC lattice filter to provide both accurate transconductance and a group delay that approximately matches the delay through the FLASH1-IDAC2A path. The residue current is then digitized by the second-order second stage. The second stage consists of an active-RC resonator, a 17-level flash ADC (FLASH2), current steering DACs (IDAC2B and IDAC3), and a capacitive-DAC (CDAC2) used to provide a DFB loop. The second stage uses a feedback topology to minimize STF peaking and the input full-scale of the second stage is scaled down to provide an inter-stage gain of six to minimize the overall quantization noise floor while preventing the residue of the first stage from saturating the second stage. The digital outputs of both stages, V1 and V2, are fed to the digital backend for further processing. A 10-tap programmable FIR filter (DNCF) can implement digital quantization noise cancellation and equalization after decimation (DEC) by a factor of four. DNCF coefficients can be generated using an off-chip LMS algorithm during an integrated start-up calibration phase.

In some cases, delta-sigma ADCs are typically followed by decimation filters that remove high-frequency noise and provide the converted signals at the required higher resolution and lower data rates. The digital noise cancellation filter may be implemented after these decimation filters, and without any loss of generality, the equalization filter can still be made a part of the digital noise cancellation filter.

Many examples herein show a two-stage MASH ADC. There may be applications where a MASH ADC needs more than two stages and where it is necessary to cancel not only the quantization noise from the first stage but from other stages as well. The described methods are also applicable to those cases, as long as programmable filters are available in corresponding the noise cancellation paths.

The embodiments described herein is applicable for continuous-time MASH ADC (which uses continuous-time circuits), discrete-time MASH ADCs (which uses switched-capacitor circuits), or a hybrid continuous-time and discrete-time MASH ADC.

The embodiments described here are particularly applicable when the noise cancellation includes programmable filters on both the signal and noise paths. Having programmable digital filters on both signal and noise paths ensures that a filter response modification can be made commonly to both paths. If the cancellation uses a fixed filter on one of the paths, a separate, dedicated equalization filter with may be implemented for that path, while a programmable filter used on another one of the paths can be updated to combine the transfer function and EQF that achieves the full system STF (thus still benefiting from some area and power savings). Quantization noise cancellation is generally done at the output of the first two stages, but may not be performed for the third or later stages. The combining of the quantization noise cancellation and equalization can still be done for the programmable filters filtering the respective outputs of the first and second stages.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as transmitters, receivers, transceivers, processors, external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

The present architecture for digital noise cancellation and equalization are particularly suitable for high speed, continuous-time, high precision applications where MASH ADCs are used. Applications which can greatly benefit from the architecture include: instrumentation, testing, spectral analyzers, military purposes, radar, wired or wireless communications, mobile telephones (especially because standards continue to push for higher speed communications), and base stations.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related digital noise cancellation and equalization, such as the processes shown in FIGS. 5, 9, and 10A-C, illustrate only some of the possible functions that may be executed by, or within, the system illustrated in FIGS. 4B and 11. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for digital quantization noise cancellation and equalization for a system having a multi-stage noise shaping analog-to-digital converter (MASH ADC), the method comprising:
   determining a digital transfer function response of a particular stage in the MASH ADC;
   determining an equalization filter response; and
   combining the digital transfer function response and the equalization filter response into a combined digital filter.

2. The method of claim 1, further comprising:
   filtering, by the combined digital filter, a digital output of a different stage in the MASH ADC.

3. The method of claim 1, wherein the digital transfer function of the particular stage is a digital signal transfer function estimating an actual signal transfer function of the particular stage.

4. The method of claim 1, wherein the digital transfer function of the particular stage is a digital noise transfer function estimating an actual noise transfer function of the particular stage.

5. The method of claim 1, further comprising:
   determining a desired signal transfer function response for the system having the MASH ADC.

6. The method of claim 1, wherein determining the equalization filter response comprises determining the equalization filter response based on a desired signal transfer function response and transfer functions in a signal path of the MASH ADC.

7. The method of claim 1, wherein combining the digital transfer function response and the equalization filter response comprises:
convolving the digital transfer function response with the equalization filter response in a time domain to determine filter coefficients of the combined digital filter.

8. The method of claim 1, further comprising:
writing filter coefficients of the combined digital filter to a programmable finite impulse response filter.

9. A system having digital quantization noise cancellation and equalization, the system comprising:
multi-stage noise shaping analog-to-digital converter (MASH ADC);
circuitry for estimating a transfer function response of a particular stage of the MASH ADC;
a programmable filter for filtering a further stage of the MASH ADC; and
logic for computing coefficients of the programmable filter based on the estimated transfer function response and a determined equalization filter response.

10. The system of claim 9, wherein the MASH ADC is a continuous-time MASH ADC.

11. The system of claim 9, wherein:
the MASH ADC comprises at least a first stage and a subsequent second stage;
the particular stage is the subsequent second stage in the MASH ADC; and
the circuitry for estimating the transfer function response comprises circuitry for making measurements of the subsequent second stage of MASH ADC and determining a digital signal transfer function response as the estimated transfer function response, which estimates an actual signal transfer function of the subsequent second stage of MASH ADC, from the measurements.

12. The system of claim 9, wherein:
the MASH ADC comprises at least a first stage and a subsequent second stage;
the particular stage is the first stage in the MASH ADC; and
the circuitry for estimating the transfer function response comprises circuitry for making measurements of the first stage of MASH ADC and determining a digital noise transfer function response as the estimated transfer function response, which estimates an actual noise transfer function of the first stage of MASH ADC, from the measurements.

13. The system of claim 9, wherein the programmable filter processes a digital output generated by the further stage prior to combining results from the stages of the MASH ADC for a final digital output.

14. The system of claim 9, wherein the logic for computing the coefficients of the programmable filter comprises logic for determining the determined equalization filter response from a desired signal transfer function response of the system and transfer functions in a signal path of the MASH ADC.

15. The system of claim 9, wherein the logic for computing the coefficients of the programmable filter comprises combining the estimated transfer function response and the determined equalization filter response into a single digital filter.

16. The system of claim 9, wherein:
the programmable filter is a programmable finite impulse response filter.

17. The system of claim 16, further comprising:
circuitry for writing the coefficients of the programmable filter to the programmable finite impulse response filter.

18. An apparatus having digital quantization noise cancellation and equalization, the apparatus comprising:
multi-stage noise shaping analog-to-digital converter (MASH ADC);
programmable means for filtering a digital output of a particular stage of the MASH ADC; and
means for computing coefficients of the programmable means based on an estimated transfer function response of a further stage of the MASH ADC and a determined equalization filter response.

19. The apparatus of claim 18, further comprising:
means for measuring of the further stage of MASH ADC; and
means for determining the estimated transfer function response, which estimates an actual signal transfer function of the further stage of MASH ADC, from the measurements.

20. The apparatus of claim 18, wherein means for computing coefficients of the programmable filter comprises:
means for determining the determined equalization filter response from a desired signal transfer function response of the apparatus and transfer functions in a signal path of the MASH ADC; and
means for combining the estimated transfer function response of the further stage of the MASH ADC and the determined equalization filter response.

* * * * *